(12) United States Patent
Shamsinejad (10) Patent No.: US 12,282,112 B2
(45) Date of Patent: Apr. 22, 2025

(54) PHASED ARRAY ANTENNA CALIBRATION SYSTEM AND METHODS FOR USE IN MILLIMETER WAVE APPLICATIONS

(71) Applicant: BDCM A2 LLC, Dover, DE (US)

(72) Inventor: Souren Shamsinejad, Irvine, CA (US)

(73) Assignee: BDCM A2 LLC, Dover, DE (US)

( * ) Notice: Subject to any disclaimer, the term of this patent is extended or adjusted under 35 U.S.C. 154(b) by 441 days.

(21) Appl. No.: 17/627,121

(22) PCT Filed: Jul. 16, 2020

(86) PCT No.: PCT/US2020/042419
§ 371 (c)(1),
(2) Date: Jan. 13, 2022

(87) PCT Pub. No.: WO2021/011825
PCT Pub. Date: Jan. 21, 2021

(65) Prior Publication Data
US 2022/0268886 A1    Aug. 25, 2022

Related U.S. Application Data

(60) Provisional application No. 62/874,904, filed on Jul. 16, 2019.

(51) Int. Cl.
  *G01S 7/40*      (2006.01)
  *G01R 29/10*     (2006.01)
  *G01S 13/931*    (2020.01)
  *H01Q 3/26*      (2006.01)

(52) U.S. Cl.
  CPC ............ *G01S 7/4004* (2013.01); *G01R 29/10* (2013.01); *G01S 13/931* (2013.01); *H01Q 3/267* (2013.01)

(58) Field of Classification Search
  CPC .... G01S 7/4004; G01S 7/4008; G01S 7/4017; G01S 7/4021; G01R 29/10; G01R 29/105; H01Q 3/267
  See application file for complete search history.

(56) References Cited

U.S. PATENT DOCUMENTS

| 4,783,666 A * | 11/1988 | Ast ........................ | H01Q 1/424 343/873 |
| 6,084,545 A * | 7/2000 | Lier ....................... | H01Q 3/267 342/174 |
| 6,157,343 A * | 12/2000 | Andersson ............. | H01Q 3/267 342/174 |

(Continued)

FOREIGN PATENT DOCUMENTS

WO     WO 2019/060287     3/2019

*Primary Examiner* — Peter M Bythrow
(74) *Attorney, Agent, or Firm* — Dinsmore & Shohl LLP (57) ABSTRACT

Examples disclosed herein relate to a phased array antenna calibration system. The system includes a radio frequency (RF) probe configured to transmit and receive an RF signal, a probe layer coupled to the RF probe via a transmission line layer and configured to transmit or receive the RF signal with the RF probe. In some aspects, the probe layer comprising a plurality of probe elements arranged in an array that corresponds to an arrangement of radiating elements in an antenna-under-test (AUT). The system also includes a foam layer coupled to the probe layer and configured to isolate the AUT from the probe layer.

20 Claims, 6 Drawing Sheets

(56) References Cited

U.S. PATENT DOCUMENTS

| | | | | |
|---|---|---|---|---|
| 6,252,542 | B1* | 6/2001 | Sikina | H01Q 3/267 342/174 |
| 6,507,315 | B2* | 1/2003 | Purdy | H01Q 25/00 342/174 |
| 6,636,173 | B2* | 10/2003 | Graham | H01Q 3/267 342/174 |
| 6,686,873 | B2* | 2/2004 | Patel | H01Q 3/267 342/368 |
| 6,771,216 | B2* | 8/2004 | Patel | H01Q 3/267 342/368 |
| 7,031,669 | B2* | 4/2006 | Vaidyanathan | H04B 1/0483 342/383 |
| 7,408,507 | B1* | 8/2008 | Paek | H01Q 15/0053 342/368 |
| 8,750,354 | B1* | 6/2014 | Heruska | H04B 5/73 375/377 |
| 9,791,552 | B1* | 10/2017 | Schuman | H01Q 3/267 |
| 9,985,733 | B1* | 5/2018 | Lee | H04B 17/102 |
| 10,564,202 | B2* | 2/2020 | Schrattenecker | G01S 7/40 |
| 11,355,836 | B2* | 6/2022 | Johansson | H01Q 1/422 |
| 11,789,118 | B2* | 10/2023 | Rosu | G01S 7/4021 342/174 |
| 2013/0044033 | A1* | 2/2013 | Nickel | G01R 29/10 343/703 |
| 2013/0093447 | A1* | 4/2013 | Nickel | G01R 29/10 324/750.16 |
| 2016/0043778 | A1* | 2/2016 | Sikina | H01Q 3/267 455/41.1 |
| 2017/0077613 | A1* | 3/2017 | Banu | H04B 1/18 |
| 2017/0301988 | A1* | 10/2017 | Schuman | G01S 7/4026 |
| 2020/0304216 | A1* | 9/2020 | Cooper | H01Q 21/062 |
| 2021/0265742 | A1* | 8/2021 | Lee | G01R 29/10 |

* cited by examiner

PHASED ARRAY ANTENNA CALIBRATION SYSTEM AND METHODS FOR USE IN MILLIMETER WAVE APPLICATIONS

CROSS REFERENCE TO RELATED APPLICATIONS

This application is a U.S. national stage application under 35 U.S.C. § 371 of International Patent Application No. PCT/US2020/042419, titled "PHASED ARRAY ANTENNA CALIBRATION SYSTEM AND METHODS FOR USE IN MILLIMETER WAVE APPLICATIONS," filed on Jul. 16, 2020, which claims priority to U.S. Prov. Appl. No. 62/874,904, titled "PHASED ARRAY ANTENNA CALIBRATION SYSTEM AND METHODS FOR USE IN MILLIMETER WAVE APPLICATIONS," filed on Jul. 16, 2019, all of which are incorporated by reference herein in their entirety.

BACKGROUND

Phased array antennas form a radiation pattern by combining signals from a number of antenna elements and controlling the phase and amplitude of each element. The antenna or radiating elements are arranged in an array or sub-arrays and typically include patches in a patch antenna configuration, a dipole, or a magnetic loop, among others. The relative phase between each radiating element can be fixed or adjusted by employing phase shifters connected to each element. The direction of the beam generated by the antenna is controlled by changing the phase of the individual elements. Amplifiers connected between the radiating elements and the phase shifters provide amplitude control of the radiating beam. The ability to control amplitude and phase precisely depends on an effective calibration of the antenna elements, phase shifters and amplifiers to compensate for any variances and signals perturbations due to manufacturing, hardware issues, temperature, environment, and other effects.

Antenna calibration consists of determining near-field and far-field radiation patterns for the antenna under different operating parameters and conditions. The near-field radiation pattern is the pattern emitted in the region immediately surrounding the antenna and within a distance of a wavelength or less. Anything beyond the near-field is deemed to be far-field. The far-field radiation pattern depends upon the distance to the antenna. Conventional near-field and far-field calibration can be performed with various measurement systems and calibration probes that are commercially available and suitable for different scenarios, applications and certain frequency bands. Each element in the phased array antenna needs to be calibrated to correct for phase and amplitude variations. The calibration of phased array antennas in millimeter wave applications beyond 70 GHz is particularly challenging.

BRIEF DESCRIPTION OF THE DRAWINGS

The present application may be more fully appreciated in connection with the following detailed description taken in conjunction with the accompanying drawings, which are not drawn to scale and in which like reference characters refer to like parts throughout, and wherein.

DETAILED DESCRIPTION

Phased array antenna calibration systems and methods for use in millimeter wave applications are disclosed. The calibration systems are designed to calibrate each individual element in an antenna-under-test. In various examples, a calibration system includes a calibration probe layer placed above the AUT, with a foam layer therebetween. An RF probe is connected to all elements in the probe layer via a feed network. The calibration probe layer is effectively an antenna having elements that are diametrically positioned above the AUT elements in a one-to-one correspondence. The RF probe can transmit/receive an RF signal to/from all the AUT elements to calibrate a receive/transmit phased array. A post-processing module connected to the calibration system characterizes the performance of the AUT during calibration, which may be performed element by element.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology. In other instances, well-known methods and structures may not be described in detail to avoid unnecessarily obscuring the description of the examples. Also, the examples may be used in combination with each other.

Figure 1:
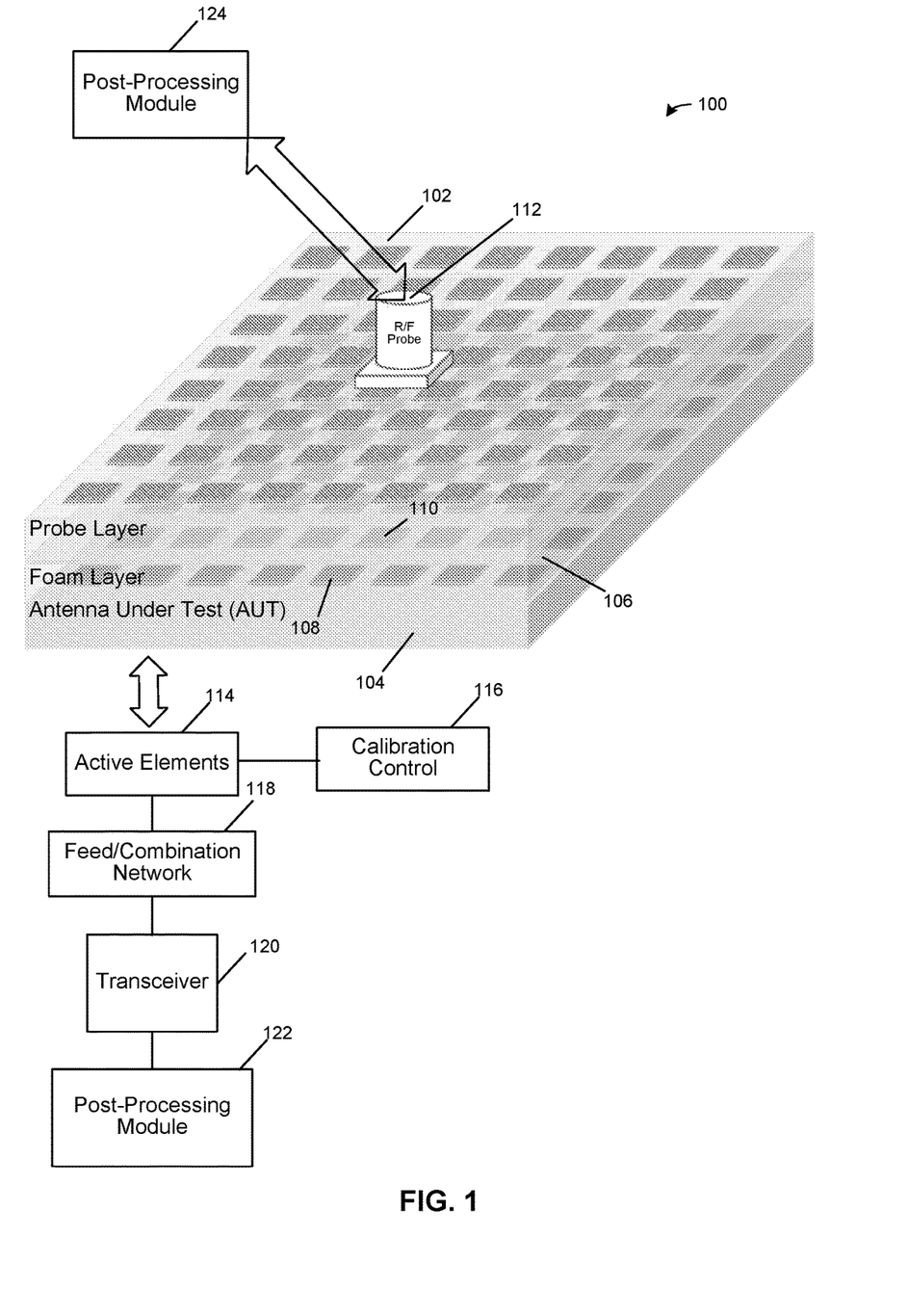
FIG. 1 illustrates a schematic diagram of a phased array calibration system for use in millimeter wave applications in accordance with various examples.

FIG. 1 illustrates a schematic diagram of a phased array calibration system for use in millimeter wave applications in accordance with various examples. Calibration system 100 has a calibration probe layer 102 placed above AUT 104, with a foam layer 106 therebetween. The AUT 104 is a patch antenna with an array of radiating elements such as AUT element 108. The calibration probe layer 102 is designed such that it contains an array of probe elements in a one-to-one correspondence with the radiating elements in the AUT 104. In some implementations, the array of probe elements may have a 1×N correspondence with the radiating elements in the AUT 104, where a probe element may correspond to N radiating elements. In other implementations, the radiating elements in the AUT 104 may have a 1×N correspondence with the array of probe elements, where a radiating element in the AUT 104 may correspond to N probe elements. Each probe element in the calibration probe layer 102 has the same dimension and configuration as its corresponding radiating element in the AUT 104, such as probe element 110 and AUT element 108. In some implementations, one or more probe elements in the calibration probe layer 102 may have a different dimension and/or configuration than its corresponding radiating element in the AUT 104. The calibration probe layer 102 is effectively a patch antenna having patch elements that are diametrically positioned above the radiating elements in the AUT 104.

The AUT 104 can be a transmit and/or a receive antenna. An RF probe 112 can both transmit and receive RF signals for calibration of the AUT 104. Calibration of a receive AUT is performed by having the RF probe 112 transmit an RF signal to all probe elements in probe layer 102 via a feed network, illustrated in more detail in FIG. 2. In some aspects, the RF signal may include orthogonal properties to improve calibration performance of the RF signal. Each probe element receives a signal from RF probe 112 and the received signal is radiated to its corresponding AUT element. The AUT 104 is connected to a plurality of active elements 114, which may include power amplifiers ("PAs"), low noise amplifiers ("LNAs"), phase shifters ("PSs") and/or switches. The active elements 114 are controlled by calibration control module 116, which can activate one or multiple of the active elements 114 to calibrate the corresponding AUT element(s). In some aspects, the probe elements may include passive components (e.g., inductance, capacitance, resistive properties). In other aspects, the probe elements may include active components. For example, the probe elements can be coupled to active elements, such as power amplifiers, low noise amplifiers, switches, mixers and/or phase shifters to improve the calibration performance and signal quality in either the transmitted or received RF signaling with the probe elements.

In one example, a single-phase shifter in active elements 114 is activated at a time to calibrate the AUT element connected to that phase shifter and compensate for any phase mismatch. The same can be done for amplitude calibration by activating the PA/LNA connected to the AUT element. The non-activated elements are disconnected from the transceiver 129 and matched to proper termination. In other examples, multiple phase shifters may be activated during phase calibration and multiple PAs/LNAs may be activated during amplitude calibration. A combination network 118 directs the signal(s) from the active AUT element(s) into transceiver 120. A post-processing module 122 processes the calibration signal to measure the received radiation pattern from each AUT element, reduce leakage from adjacent AUT elements and determine the operating characteristics of the calibrated AUT element(s).

Conversely, calibration of a transmit AUT is performed by having the transceiver 120 transmit an RF signal to an activated AUT element in the AUT 104 via feed network 118 for radiation into its corresponding probe element in the probe layer 102. The RF probe 112 then receives a combined signal from all the probe elements via the feed network, which also functions as a combination network. The combined signal is analyzed by a post-processing module 124 to determine the operating characteristic of the activated AUT element in the AUT 104. In various examples, post-processing modules 122 and 124 may be the same or separate post-processing modules.

Note that the calibration system 100 operates to analyze far-field radiation patterns received and transmitted by AUTs. The thickness of the foam layer 106 is about a wavelength, which is around 3-4 mm for millimeter wave frequencies used for radar applications in the automotive industry. The calibration system 100 works by having a one-to-one correspondence between each AUT element and each probe element in a close distance that is sufficient for far-field measurements of single elements.

Figure 2:
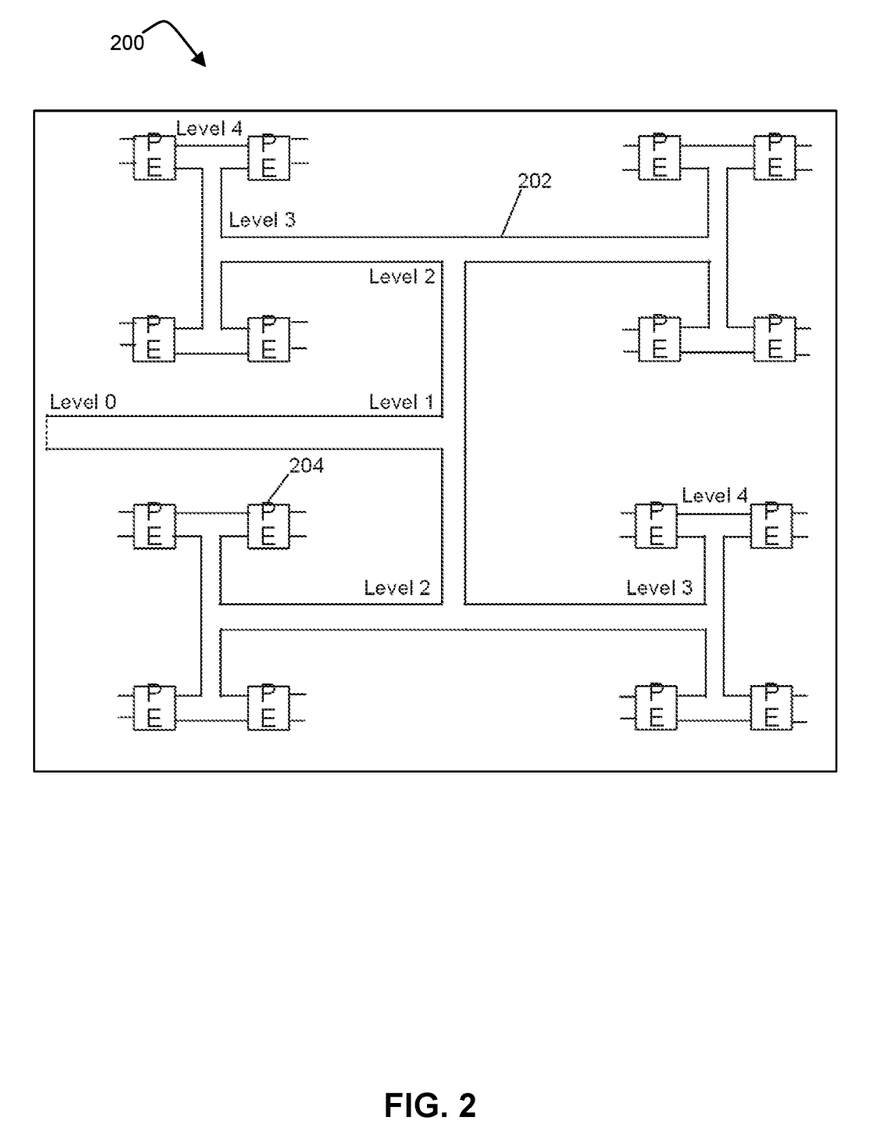
FIG. 2 illustrates an example feed network for use in a probe layer implemented as in FIG. 1.

FIG. 2 illustrates an example feed network for use in a probe layer implemented as in FIG. 1. Feed network layer 202 in calibration probe layer 200 provides a corporate feed dividing an RF signal received from an RF probe (e.g., RF probe 112 of FIG. 1) for propagation to probe elements, such as probe element 204. In the illustrated example, the feed network layer 202 is a type of a power divider circuit such that it takes an input signal and divides it uniformly through a network of paths or transmission lines. Each path may have similar dimensions; however, the size of the paths may be configured to achieve a desired transmission and/or radiation result. Each transmission line is a path in the feed network 202, which is shown to have 4 levels, wherein in each level the feed network 202 doubles its paths: level 0 has 1 path, level 1 has 2 paths, level 2 has 4 paths, level 3 has 8 paths, and level 4 has 16 paths. The feed network 202 is designed to be impedance-matched, such that the impedances at each end of a transmission line matches the characteristic impedance of the line.

Note that each end of a level 4 transmission line in the feed network layer leads to a probe element, such as probe element ("PE") 204. In the illustrated example, there are 16 PEs corresponding to the 4 levels in the feed network layer of 16 transmission lines. Probe calibration layer 200 is formed in a substrate, such as a Rogers material, having specific parameters, such as low dielectric loss, and so forth, that are applicable to millimeter wave frequencies. For example, a Rogers CLTE-AT product exhibits thermal and phase stability across temperature and is used in automotive radar and microwave applications. Note also that, in other examples, feed network 202 can operate as a combination network to receive signals from the probe elements in case the AUT is a transmit antenna.

Figure 3:
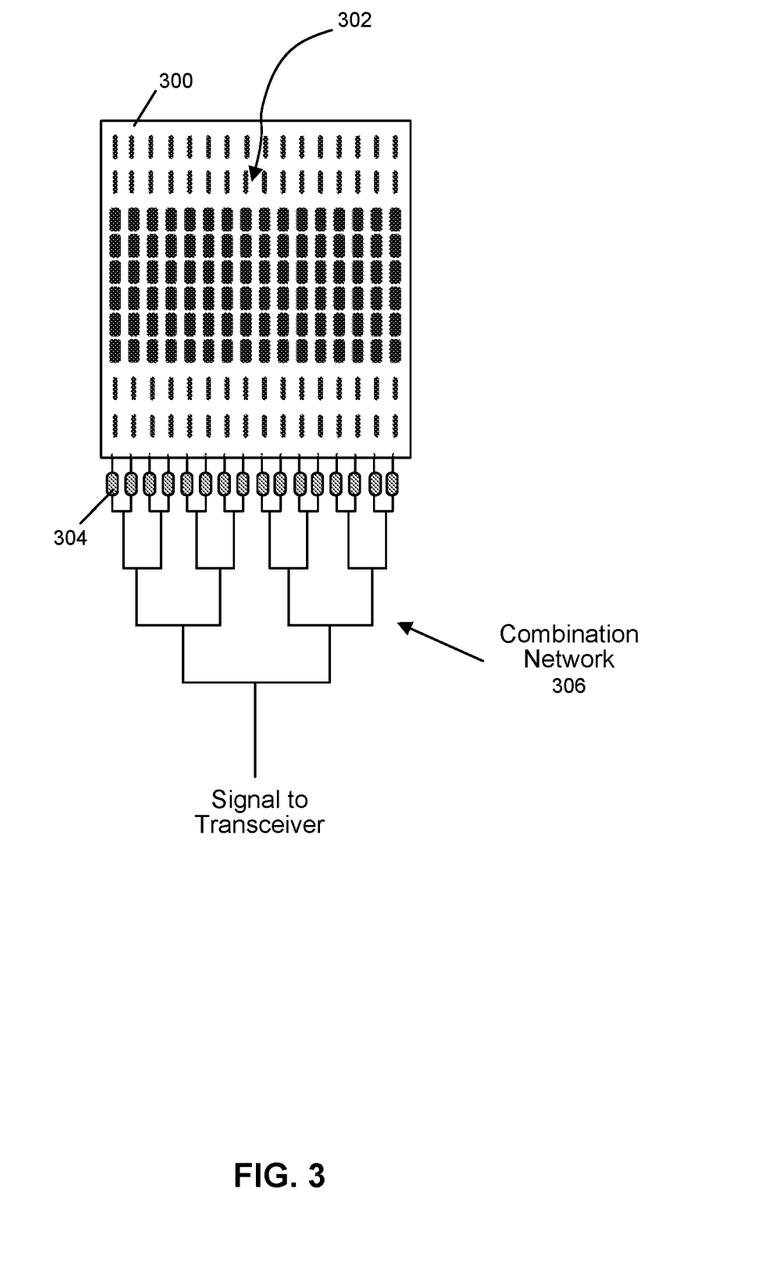
FIG. 3 shows an example receive antenna-under-test ("AUT") for use in millimeter wave applications in more detail.

Attention is now directed to FIG. 3, which shows an example receive AUT for use in millimeter applications in more detail. Receive antenna 300 has a number of radiating elements 302 creating receive paths for signals or reflections from a target. In various implementations, the radiating elements 302 are meta-structures or patches in an array configuration such as in a 48-element antenna. The phase and amplification modules 304 provide phase shifting to align the signals in time. The radiating elements 302 are connected to the combination network 306 and to phase and amplification modules 304, including phase shifters and LNAs. In the present illustration, antenna 300 is used in an automotive radar to receive reflections from objects, such as other vehicles, pedestrians, road signs, and so forth.

Figure 4:
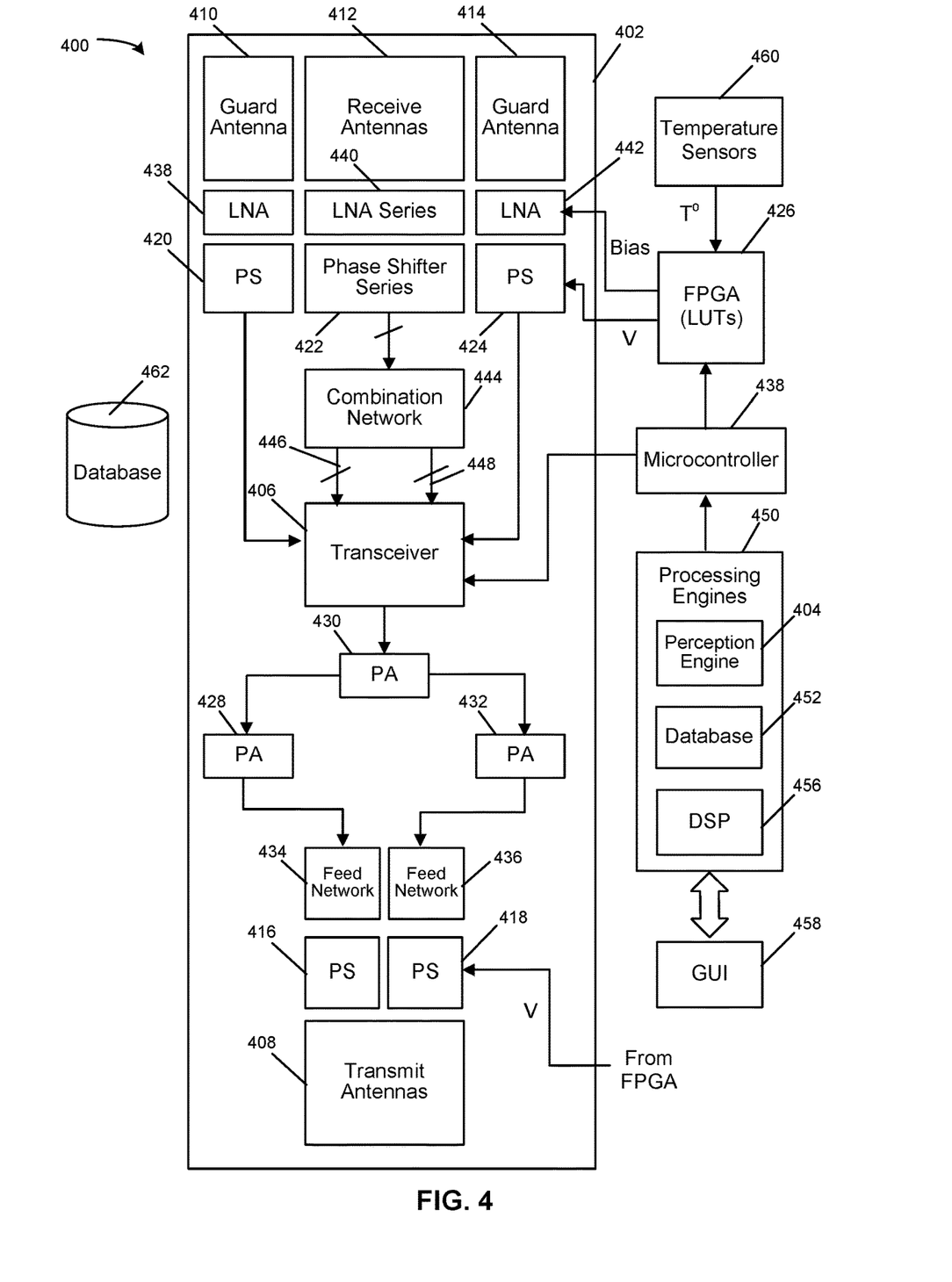
FIG. 4 illustrates a schematic diagram of a beam steering radar system in accordance with various examples.

FIG. 4 illustrates a schematic diagram of a beam steering radar system in accordance with various examples. Beam steering radar 400 is a "digital eye" with true 3D vision and capable of a human-like interpretation of the world. The "digital eye" and human-like interpretation capabilities are provided by two main modules: a radar module 402 and a perception engine 404. Radar module 402 is capable of both transmitting RF signals within a field of view ("FoV") and receiving the reflections of the transmitted signals as they reflect off of objects in the FoV. With the use of analog beamforming in radar module 402, a single transmit and receive chain can be used effectively to form a directional, as well as a steerable, beam. A transceiver 406 in radar module 402 is adapted to generate signals for transmission through a series of transmit antennas 408 as well as manage signals received through a series of receive antennas 410-414. Beam steering within the FoV is implemented with phase shifter ("PS") circuits 416-418 connected to the transmit antennas 408 on the transmit chain and PS circuits 420-424 connected to the receive antennas 410-414 on the receive chain, respectively. Careful calibration of transmit antennas 408 and receive antennas 410-414 can be performed with the calibration system 100 of FIG. 1 under different operating conditions.

The use of PS circuits 416-418 and 420-424 enables separate control of the phase of each element in the transmit and receive antennas. Unlike early passive architectures, the beam is steerable not only to discrete angles but to any angle (i.e., from 0° to 360°) within the FoV using active beamforming antennas. A multiple element antenna can be used with an analog beamforming architecture where the individual antenna elements may be combined or divided at the port of the single transmit or receive chain without additional hardware components or individual digital processing for each antenna element. Further, the flexibility of multiple element antennas allows narrow beam width for transmit and receive. The antenna beam width decreases with an increase in the number of antenna elements. A narrow beam improves the directivity of the antenna and provides the radar 400 with a significantly longer detection range.

The major challenge with implementing analog beam steering is to design PSs to operate at 77 GHz. PS circuits 416-418 and 420-424 solve this problem with a reflective PS design implemented with a distributed varactor network currently built using GaAs materials. Each PS circuit 416-418 and 420-424 has a series of PSs, with each PS connected to an antenna element to generate a phase shift value of anywhere from 0° to 360° for signals transmitted or received by the antenna element. The PS design is scalable in future implementations to silicon-germanium (SiGe) and complementary metal-oxide semiconductors (CMOS), bringing down the PS cost to meet specific demands of customer applications. Each PS circuit 416-418 and 420-424 is controlled by a Field Programmable Gate Array ("FPGA") 426, which provides a series of voltages to the PSs in each PS circuit that results in a series of phase shifts.

In various examples, a voltage value is applied to each PS in the PS circuits 416-418 and 420-424 to generate a given phase shift and provide beamsteering. The voltages applied to the PSs in PS circuits 416-418 and 420-424 are stored in Look-up Tables ("LUTs") in the FPGA 406. These LUTs are generated by an antenna calibration process that determines which voltages to apply to each PS to generate a given phase shift under each operating condition. Note that the PSs in PS circuits 416-418 and 420-424 are capable of generating phase shifts at a very high resolution of less than one degree. This enhanced control over the phase allows the transmit and receive antennas in radar module 402 to steer beams with a very small step size, improving the capability of the radar 400 to resolve closely located targets at small angular resolution.

In various examples, the transmit antennas 408 and the receive antennas 410-414 may be a meta-structure antenna, a phase array antenna, or any other antenna capable of radiating RF signals in millimeter wave frequencies. A meta-structure, as generally defined herein, is an engineered structure capable of controlling and manipulating incident radiation at a desired direction based on its geometry. Various configurations, shapes, designs and dimensions of the antennas 408-414 may be used to implement specific designs and meet specific constraints, such as antenna 300 shown in FIG. 3.

The transmit chain in radar 400 starts with the transceiver 406 generating RF signals to prepare for transmission over-the-air by the transmit antennas 408. The RF signals may be, for example, Frequency-Modulated Continuous Wave ("FMCW") signals. An FMCW signal enables the radar 400 to determine both the range to an object and the object's velocity by measuring the differences in phase or frequency between the transmitted signals and the received/reflected signals or echoes. Within FMCW formats, there are a variety of waveform patterns that may be used, including sinusoidal, triangular, sawtooth, rectangular and so forth, each having advantages and purposes.

Once the FMCW signals are generated by the transceiver 406, they are provided to power amplifiers ("PAs") 428-432. Signal amplification is needed for the FMCW signals to reach the long ranges desired for object detection, as the signals attenuate as they radiate by the transmit antennas 408. From the PAs 428-432, the signals are divided and distributed through feed networks 434-436, which form a power divider system to divide an input signal into multiple signals, one for each element of the transmit antennas 408. The feed networks 434-436 may divide the signals so power is equally distributed among them or alternatively, so power is distributed according to another scheme, in which the divided signals do not all receive the same power. Each signal from the feed networks 434-436 is then input into a PS in PS circuits 416-418, where they are phase shifted based on voltages generated by the FPGA 426 under the direction of microcontroller 438 and then transmitted through transmit antennas 408.

Microcontroller 438 determines which phase shifts to apply to the PSs in PS circuits 416-418 according to a desired scanning mode based on road and environmental scenarios. Microcontroller 438 also determines the scan parameters for the transceiver to apply at its next scan. The scan parameters may be determined at the direction of one of the processing engines 450, such as at the direction of perception engine 404. Depending on the objects detected, the perception engine 404 may instruct the microcontroller 438 to adjust the scan parameters at a next scan to focus on a given area of the FoV or to steer the beams to a different direction.

In various examples and as described in more detail below, radar 400 operates in one of various modes, including a full scanning mode and a selective scanning mode, among others. In a full scanning mode, both transmit antennas 408 and receive antennas 410-414 scan a complete FoV with small incremental steps. Even though the FoV may be limited by system parameters due to increased side lobes as a function of the steering angle, radar 400 is able to detect objects over a significant area for a long-range radar. The range of angles to be scanned on either side of boresight as well as the step size between steering angles/phase shifts can be dynamically varied based on the driving environment. To improve performance of an autonomous vehicle (e.g., an ego vehicle) driving through an urban environment, the scan range can be increased to keep monitoring the intersections and curbs to detect vehicles, pedestrians or bicyclists. This wide scan range may deteriorate the frame rate (revisit rate), but is considered acceptable as the urban environment generally involves low velocity driving scenarios. For a high-speed freeway scenario, where the frame rate is critical, a higher frame rate can be maintained by reducing the scan range. In this case, a few degrees of beam scanning on either side of the boresight would suffice for long-range target detection and tracking.

In a selective scanning mode, radar 400 scans around an area of interest by steering to a desired angle and then scanning around that angle. This ensures the radar 400 is to detect objects in the area of interest without wasting any processing or scanning cycles illuminating areas with no valid objects. Since the radar 400 is capable of detecting objects at a long distance, e.g., 300 m or more at boresight, if there is a curve in a road, direct measures do not provide helpful information. Rather, the radar 400 steers along the curvature of the road and aligns its beams towards the area of interest. In various examples, the selective scanning mode may be implemented by changing the chirp slope of the FMCW signals generated by the transceiver 406 and by shifting the phase of the transmitted signals to the steering angles needed to cover the curvature of the road.

Objects are detected with radar 400 by reflections or echoes that are received at the series of receive antennas 410-414, which are directed by PS circuits 420-424. Low Noise Amplifiers ("LNAs") are positioned between receive antennas 410-414 and PS circuits 420-424, which include PSs similar to the PSs in PS circuits 416-418. For receive operation, PS circuits 410-424 create phase differentials between radiating elements in the receive antennas 410-414 to compensate for the time delay of received signals between radiating elements due to spatial configurations. Receive phase-shifting, also referred to as analog beamforming, combines the received signals for aligning echoes to identify the location, or position of a detected object. That is, phase shifting aligns the received signals that arrive at different times at each of the radiating elements in receive antennas 410-414. Similar to PS circuits 416-418 on the transmit chain, PS circuits 420-424 are controlled by FPGA 426, which provides the voltages to each PS to generate the desired phase shift. FPGA 426 also provides bias voltages to the LNAs 438-442.

The receive chain then combines the signals received at receive antennas 412 at combination network 444, from which the combined signals propagate to the transceiver 406. Note that as illustrated, combination network 444 generates two combined signals 446-448, with each signal combining signals from a number of elements in the receive antennas 412. In one example, receive antennas 412 include 48 radiating elements and each combined signal 446-448 combines signals received by 24 of the 48 elements. Other examples may include 8, 16, 24, 32, and soon, depending on the desired configuration. The higher the number of antenna elements, the narrower the beam width.

Note also that the signals received at receive antennas 410 and 414 go directly from PS circuits 420 and 424 to the transceiver 406. Receive antennas 410 and 414 are guard antennas that generate a radiation pattern separate from the main beams received by the 48-element receive antenna 412. Guard antennas 410 and 414 are implemented to effectively eliminate side-lobe returns from objects. The goal is for the guard antennas 410 and 414 to provide a gain that is higher than the side lobes and therefore enable their elimination or reduce their presence significantly. Guard antennas 410 and 414 effectively act as a side lobe filter.

Once the received signals are received by transceiver 406, they are processed by processing engines 450. Processing engines 450 include perception engine 404 which detects and identifies objects in the received signal with neural network and artificial intelligence techniques, database 452 to store historical and other information for radar 400, and a Digital Signal Processing ("DSP") engine 454 with an Analog-to-Digital Converter ("ADC") module to convert the analog signals from transceiver 406 into digital signals that can be processed to determine angles of arrival and other valuable information for the detection and identification of objects by perception engine 404. In one or more implementations, DSP engine 454 may be integrated with the microcontroller 438 or the transceiver 406.

Radar 400 also includes a Graphical User Interface ("GUI") 458 to enable configuration of scan parameters such as the total angle of the scanned area defining the FoV, the beam width or the scan angle of each incremental transmission beam, the number of chirps in the radar signal, the chirp time, the chirp slope, the chirp segment time, and so on as desired. In addition, radar 400 has a temperature sensor 460 for sensing the temperature around the vehicle so that the proper voltages from FPGA 426 may be used to generate the desired phase shifts. The voltages stored in FPGA 426 are determined during calibration of the antennas under different operating conditions, including temperature conditions. A database 462 may also be used in radar 400 to store radar and other useful data.

Figure 5:
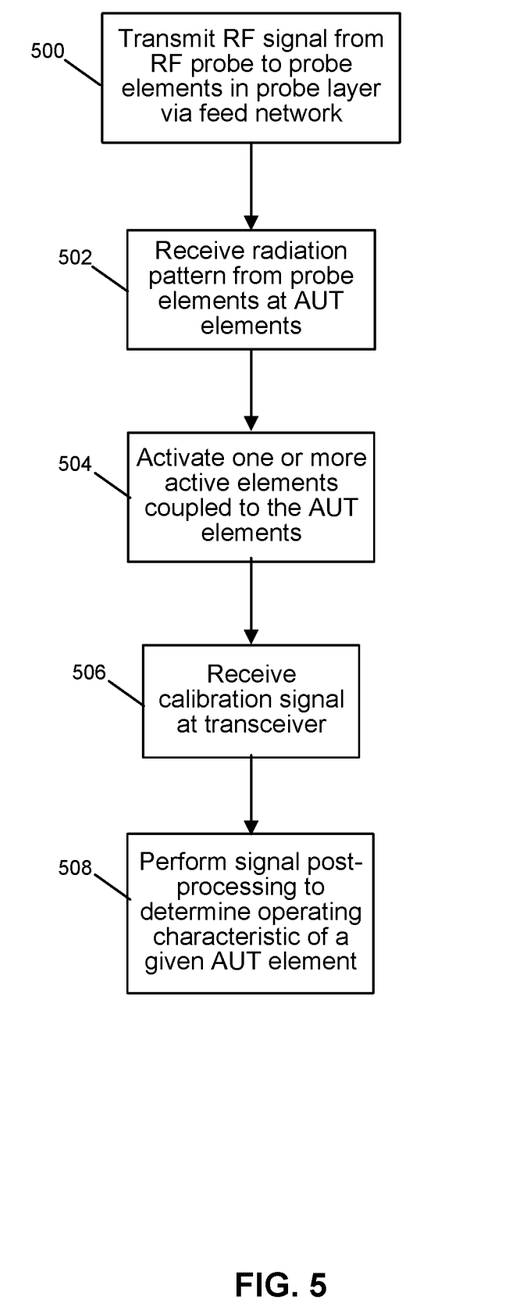
FIG. 5 is a flowchart for calibration of a receive AUT in accordance with various examples.

FIG. 5 is a flowchart for calibration of a receive AUT in accordance with various examples. First, an RF signal is transmitted from an RF probe (e.g., probe 112 of FIG. 1) to probe elements in a probe layer (e.g., probe layer 104) via a feed network in the probe layer (500). The probe elements radiate the RF signal and the radiated signal is received at the AUT elements at the AUT (502). The calibration control module 116 activates one or more active elements (e.g., LNA and/or PS) connected to one or more AUT elements (504). The signal received at the activated AUT element(s) are is then received at the transceiver through the feed/combination network (506). Lastly, the signal is processed by a post-processing module (508) to determine the operating characteristic of the activated AUT element(s). In various examples, the post-processing module suppresses the contributions of AUT elements adjacent to the given AUT element being calibrated. The operating characteristics of the given AUT element are then stored so that any adjustments to the AUT may be performed during its operation in a millimeter wave application. Note that this calibration process is repeated for each AUT element and for the desired phase and amplitude distributions to be achieved by the AUT.

Figure 6:
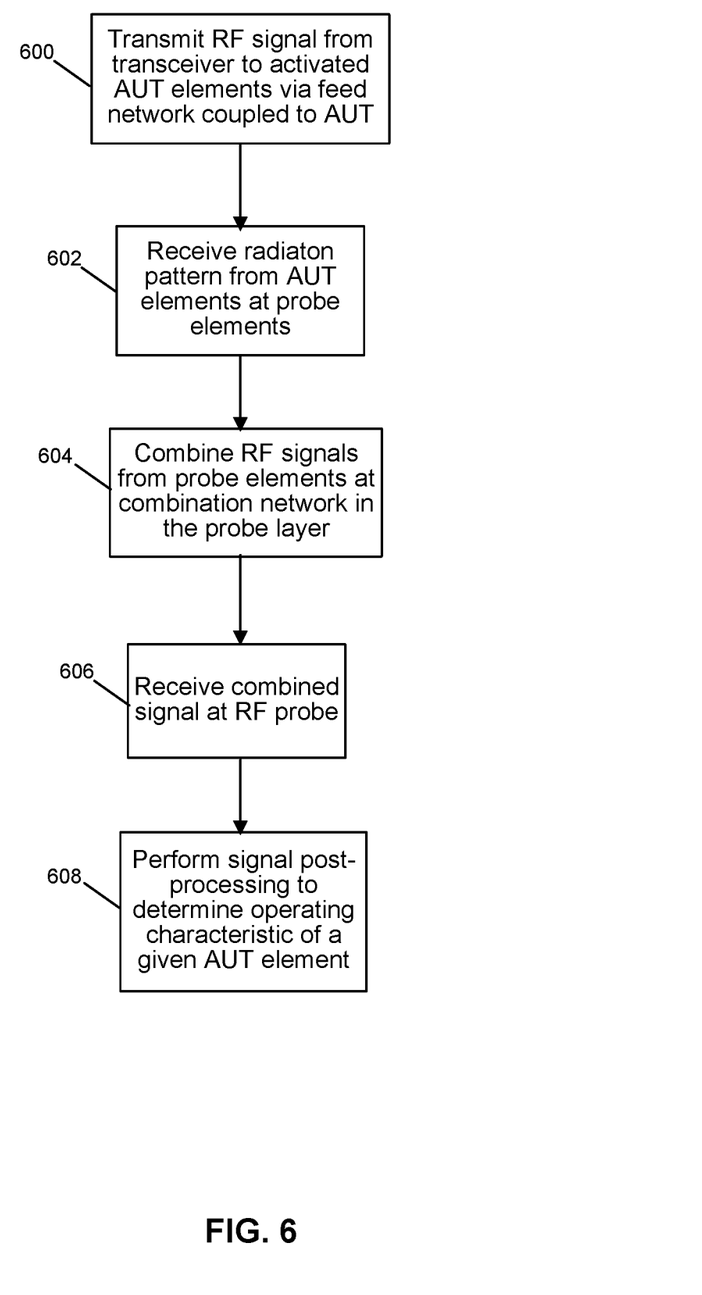
FIG. 6 is a flowchart for calibration of a transmit AUT in accordance with various examples.

FIG. 6 is a flowchart for calibration of a transmit AUT in accordance with various examples. First, an RF signal is transmitted from a transceiver to the activated AUT elements of an AUT via a feed network connected to the AUT (600). One or more AUT elements may be activated at a time by the calibration control module 116 of FIG. 1. The activated AUT elements radiate the signal to the probe elements at the probe layer (602). The RF signals received at the probe elements are then combined at the feed/combination network in the probe layer (604) and the combined signal is received at the RF probe. Lastly, signal post-processing is performed on the combined signal to determine the operating characteristic of each AUT element. The calibration system disclosed herein is able to effectively calibrate an AUT in the far-field for millimeter wave applications with a simple and easy to manufacture probe layer.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Furthermore, to the extent that the term "include," "have," or the like is used in the description or the claims, such term is intended to be inclusive in a manner similar to the term "comprise" as "comprise" is interpreted when employed as a transitional word in a claim.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. Moreover, the separation of various system components in the aspects described above should not be understood as requiring such separation in all aspects, and it should be understood that the described program components and systems can generally be integrated together in a single hardware product or packaged into multiple hardware products. Other variations are within the scope of the following claim.

What is claimed is:

1. A phased array antenna calibration system, comprising:
   a radio frequency (RF) probe configured to transmit and receive an RF signal;
   a probe layer coupled to the RF probe via a transmission line layer and configured to transmit or receive the RF signal with the RF probe, the probe layer comprising a plurality of probe elements arranged in an array that corresponds to an arrangement of radiating elements in an antenna-under-test (AUT), the plurality of probe elements in a one-to-one correspondence with the arrangement of radiating elements in the AUT, and each of the plurality of probe elements comprises a dimension and configuration to each corresponding the radiating elements in the AUT; and
   a foam layer coupled to the probe layer and configured to separate the AUT from the probe layer.

2. The phased array antenna calibration system of claim 1, wherein the foam layer is interposed between the probe layer and the AUT, the foam layer having a thickness of at least a wavelength.

3. The phased array antenna calibration system of claim 1, where in each probe element of the plurality of probe elements has a dimension and configuration that corresponds to at least in part that of a radiating element in the AUT.

4. The phased array antenna calibration system of claim 1, wherein the RF probe is configured to transmit the RF signal to the plurality of probe elements in the probe layer via the transmission line layer.

5. The phased array antenna calibration system of claim 4, wherein each probe element of the plurality of probe elements is configured to radiate the RF signal to one or more radiating elements of the AUT and to calibrate the AUT in a receive configuration based on the RF signal.

6. The phased array antenna calibration system of claim 1, further comprising:
   a plurality of active elements coupled to the transmission line layer and configured to modify a phase or an amplitude in the RF signal.

7. The phased array antenna calibration system of claim 6, further comprising:
   a calibration control module coupled to the plurality of active elements and configured to activate one or more active elements of the plurality of active elements.

8. The phased array antenna calibration system of claim 1, further comprising:
   a first post-processing module communicably coupled to the RF probe and configured to measure a transmit radiation pattern at each probe element of the plurality of probe elements that is radiated from one or more radiating elements of the AUT using a received calibration signal from the AUT and to determine an operating characteristic of a corresponding radiating element in the AUT based on the transmit radiation pattern.

9. The phased array antenna calibration system of claim 1, further comprising:
   a second post-processing module coupled to the transmission line layer and configured to measure a receive radiation pattern at each radiating element of the AUT based on the RF signal that is radiated from one or more probe elements of the plurality of probe elements using a received calibration signal from the AUT and to determine an operating characteristic of each radiating element in the AUT based on the receive radiation pattern.

10. The phased array antenna calibration system of claim 9, further comprising:
a transceiver coupled to the transmission line layer and the second post-processing module, the transceiver configured to transmit the RF signal to radiating elements in the AUT via the transmission line layer.

11. The phased array antenna calibration system of claim 1, wherein the radiating elements in the AUT are configured to radiate the RF signal to one or more probe elements of the plurality of probe elements in the probe layer based on the AUT being in a transmit configuration.

12. The phased array antenna calibration system of claim 1, wherein each probe element of the plurality of probe elements is spaced apart from one or more radiating elements in the AUT by a predetermined distance that corresponds to a thickness of the foam layer.

13. A method to calibrate a phased array receive antenna for use in millimeter wave applications, comprising:
transmitting a radio frequency (RF) signal with a RF probe to a plurality of probe elements in a probe layer via a feed network coupled to the probe layer;
receiving a radiation pattern radiated from the plurality of probe elements at a plurality of elements in an antenna-under-test (AUT), the plurality of probe elements in a one-to-one correspondence with the plurality of elements of the AUT, and each of the plurality of probe elements comprises a dimension and a configuration correspondence to each corresponding one of the radiating elements in the AUT;
activating one or more active elements of a plurality of active elements coupled to the plurality of elements of the AUT;
compensating, based on the activating, for a mismatch in phase or amplitude of the plurality of elements of the AUT;
receiving, at a transceiver via the feed network from the AUT, a calibration signal to measure the radiation pattern; and
processing, using a post-processing module, the calibration signal to determine a plurality of operating characteristics of one or more elements in the AUT connected to the activated one or more active elements.

14. The method of claim 13, further comprising:
radiating, by each probe element of the plurality of probe elements, the RF signal to one or more elements of the AUT; and
calibrating the AUT in a receive configuration based on the RF signal.

15. The method of claim 13, further comprising:
modifying, using the one or more active elements, a phase or an amplitude in the RF signal.

16. The method of claim 13, further comprising:
Measuring, using a post processing module, the radiation pattern at each element of the plurality of elements in the AUT based on the RF signal that is radiated from one or more probe elements of the plurality of probe elements using the calibration signal; and determining, using the post-processing module, an operating characteristic of each of the one or more elements in the AUT based on the radiation pattern.

17. A method to calibrate a phased array transmit antenna for use in millimeter wave applications, comprising:
transmitting a radio frequency (RF) signal from a transceiver to a plurality of radiating elements in an antenna-under-test (AUT) via a feed network connected to the AUT;
receiving a radiation pattern radiated from the plurality of radiating elements at a probe layer, the probe layer comprising a plurality of probe elements arranged in an array that corresponds to an arrangement of the plurality of radiating elements in the AUT and each of the plurality of probe elements comprises a dimension and a configuration correspondence to each corresponding one of the radiating elements in the AUT;
combining a plurality of RF signals from the plurality of probe elements at a combination network in the probe layer;
generating a combined signal based on the combining;
receiving the combined signal at an RF probe coupled to the probe layer; and
processing, using a post-processing module, the combined signal to determine a
plurality of operating characteristics for one or more radiating elements in the plurality of radiating elements.

18. The method of claim 17, further comprising:
activating, using a calibration control module, one or more active elements of a plurality of active elements.

19. The method of claim 17, further comprising:
measuring, using a post-processing module, the radiation pattern at each probe element of the plurality of probe elements based on the RF signal that is radiated from one or more radiating elements of the plurality of radiating elements in the AUT using the combined signal; and
determining, using the post-processing module, an operating characteristic of each of the plurality of radiating elements in the AUT based on the radiation pattern.

20. The method of claim 17, further comprising:
radiating, by each of the plurality of radiating elements in the AUT, the RF signal to one or more probe elements of the plurality of probe elements for calibration of the AUT in a transmit configuration.

* * * * *